(12) United States Patent
Kurowska et al.

(10) Patent No.: US 12,446,161 B2
(45) Date of Patent: Oct. 14, 2025

(54) MICROSWITCH BASED POSITION SENSOR WITH HARNESS RELIEF FOR MOTORIZED VALVE

(71) Applicant: Hamilton Sundstrand Corporation, Charlotte, NC (US)

(72) Inventors: Agata Kurowska, Kowale (PL); Dariusz Sapija, Siechnice (PL); Piotr Kostanski, Iwiny (PL)

(73) Assignee: Hamilton Sundstrand Corporation, Charlotte, NC (US)

( * ) Notice: Subject to any disclaimer, the term of this patent is extended or adjusted under 35 U.S.C. 154(b) by 1239 days.

(21) Appl. No.: 17/209,467

(22) Filed: Mar. 23, 2021

(65) Prior Publication Data

US 2021/0315106 A1  Oct. 7, 2021

(30) Foreign Application Priority Data

Apr. 3, 2020  (PL) .......................... 433449

(51) Int. Cl.
*H05K 3/34* (2006.01)
*F16K 31/04* (2006.01)
(Continued)

(52) U.S. Cl.
CPC ......... *H05K 3/3447* (2013.01); *F16K 31/042* (2013.01); *F16K 37/0041* (2013.01); *H01H 1/26* (2013.01); *H01H 3/42* (2013.01); *H01H 3/46* (2013.01); *H01H 13/186* (2013.01); *H05K 1/18* (2013.01); *H05K 3/281* (2013.01);
(Continued)

(58) Field of Classification Search
CPC ...... H05K 5/0247; H05K 3/3447; H05K 1/18; H05K 3/281; H05K 2201/0715; H05K 2201/10053; H05K 2201/10287; H05K 3/3405; H05K 2201/09063; H05K 2201/049; H05K 2201/10356; H01H 3/42; H01H 3/46; H01H 2003/463;
(Continued)

(56) References Cited

U.S. PATENT DOCUMENTS 5,372,666 A * 12/1994 Kawasaki ............ H05K 3/4667
156/89.18
5,835,356 A  11/1998 Wieloch et al.
(Continued)

FOREIGN PATENT DOCUMENTS

KR  200434180     * 12/2006
KR  20080108864 A * 12/2008

OTHER PUBLICATIONS

European Search Report for EP Application No. 21154626.2 dated Jun. 11, 2021.

*Primary Examiner* — Atif H Chaudry
(74) *Attorney, Agent, or Firm* — Carlson, Gaskey & Olds, P.C.

(57) ABSTRACT

A printed circuit board, PCB, based connector for connecting at least one wire to at least one microswitch in a position sensor for a motorised valve assembly is provided comprising a PCB comprising at least one first through hole and at least one second through hole. The at least one first through hole is configured to receive a solder pin of at least one microswitch. The at least one second through hole is configured to receive at least one wire and the PCB further comprises a slot configured to receive the at least one wire with an interference fit.

7 Claims, 4 Drawing Sheets

(51) Int. Cl.
  *F16K 37/00* (2006.01)
  *H01H 1/26* (2006.01)
  *H01H 3/42* (2006.01)
  *H01H 3/46* (2006.01)
  *H01H 13/18* (2006.01)
  *H05K 1/18* (2006.01)
  *H05K 3/28* (2006.01)
  *H05K 5/02* (2006.01)

(52) U.S. Cl.
  CPC ..... *H05K 5/0247* (2013.01); *H01H 2003/463* (2013.01); *H01H 2003/466* (2013.01); *H05K 2201/0715* (2013.01); *H05K 2201/10053* (2013.01); *H05K 2201/10287* (2013.01)

(58) Field of Classification Search
  CPC .... H01H 2003/466; H01H 3/186; H01H 1/26; F16K 37/0041
  See application file for complete search history.

(56) References Cited

U.S. PATENT DOCUMENTS

| | | |
|---|---|---|
| 7,301,755 B2 | 11/2007 | Rodriguez et al. |
| 7,355,392 B2 | 4/2008 | LaClair et al. |
| 7,635,046 B2 | 12/2009 | Tominaga et al. |
| 10,071,880 B2 | 9/2018 | Tutat et al. |
| 2002/0175789 A1* | 11/2002 | Pimouguet ......... H01H 36/0033 335/205 |
| 2007/0230142 A1 | 10/2007 | Engel et al. |
| 2007/0230144 A1* | 10/2007 | Engel .................. G01D 11/245 361/752 |
| 2009/0255721 A1 | 10/2009 | Chen |
| 2011/0042593 A1* | 2/2011 | Wilby .................. F16K 31/042 73/862.08 |
| 2015/0153048 A1 | 6/2015 | Moro |

* cited by examiner

MICROSWITCH BASED POSITION SENSOR WITH HARNESS RELIEF FOR MOTORIZED VALVE

PRIORITY CLAIM

This application claims the benefit of Polish Patent Application No. P.433449, filed on Apr. 3, 2020.

TECHNICAL FIELD

The examples described herein relate to position sensors, and in particular to microswitch based position sensors.

BACKGROUND OF THE INVENTION

In order to detect a position, stacked microswitches may be utilised as a position sensor. Typically, microswitches are stacked together and electrical wires are soldered directly to solder pins of the microswitches.

Position sensors of this type are typically used in motorized valves. For such uses, it is desirable that the position sensors are sufficiently robust, are resistant to vibrations, are resistant to electromagnetic interference, and operable at a high acceleration.

SUMMARY OF THE INVENTION

In a first aspect there is provided a printed circuit board, PCB, based connector for connecting at least one wire to at least one solder pin comprising a PCB comprising at least one first through hole and at least one second through hole; wherein the at least one first through hole is configured to receive a solder pin; wherein the at least one second through hole is configured to receive at least one wire; and wherein the PCB further comprises a slot configured to receive the at least one wire with an interference fit. Such a PCB allows for a more robust connection between wires and solder pins due to the specific configuration of the PCB, which provides a simple base for soldering, as well as preventing external forces on any incoming wires from being transmitted to the solder connection.

For example, there may be provided a printed circuit board, PCB, based connector for connecting at least one wire to at least one microswitch in a position sensor for a motorised valve assembly comprising a PCB comprising at least one first through hole and at least one second through hole; wherein the at least one first through hole is configured to receive a solder pin of at least one microswitch; wherein the at least one second through hole is configured to receive at least one wire; wherein the PCB further comprises a slot configured to receive the at least one wire with an interference fit. Such a PCB allows for a more robust connection between wires and microswitches due to the specific configuration of the PCB, which provides a simple base for soldering, as well as preventing external forces on any incoming wires from being transmitted to the solder connection.

The PCB may be a multi-layered PCB, which in turn may comprise insulating outer layers configured to provide grounding and/or shielding and/or internal signal layers. In this way, the PCB may be provided with one or more layered sheets, allowing for a higher component density as well as more robust protection from external conditions and impacts. For example, the outer layers may be insulating layers that provide grounding and shielding to the internal layers. The internal signal layers may be protected from environmental conditions, such as increased humidity which can otherwise result in corrosion of the signal layers, particularly in harsh environments in which motorised valves are usually present.

In a second aspect, there is provided a microswitch based position sensor for a motorised valve comprising the PCB as described above; at least one microswitch comprising at least one solder pin, wherein each solder pin is provided through a respective one of the first through holes so as to electrically connect to the PCB; at least one wire provided through a respective one of the second through holes so as to electrically connect to the PCB; wherein the at least one wire passes through the slot with an interference fit.

For example, there may be provided a microswitch based position sensor for a motorised valve comprising the PCB as described above, at least one microswitch, each microswitch comprising at least one solder pin, wherein each solder pin is provided through a respective one of the at least one first through hole so as to electrically connect to the PCB; at least one wire, wherein each wire is provided through a respective one of the at least one second through hole so as to electrically connect to the PCB; wherein the at least one wire passes through the slot with an interference fit. This position sensor is more robust, as well as quicker, easier and cheaper to manufacture.

The wire may be provided with a stress relief portion proximate the at least one second through hole, between the at least one second through hole and the slot. Such a stress relief portion prevents external forces on the wires from being transmitted to the soldered connection, thereby mitigating the chance of failure at the connection point.

The microswitch based position sensor may further comprise a cover provided around the PCB, slot and stress relieving portion of the wires configured to make the connection between the PCB and wires rigid. This provides further protection at the connection points. The cover may be heat shrink material, which provides further support, as well as easy manufacturing.

In a third aspect, there is provided an assembly comprising a motorised valve; and a microswitch based position sensor as described above. The valve may be a rotary ball valve with a shaped cam configured to variably contact a contact of each microswitch as the shaped cam rotates. In this way, as the shaped cam rotates (and therefore the valve rotates), the position of the cam can be sensed which in turn displays the position of the valve.

In a fourth aspect, there is provided a method of providing a connection between at least one wire and at least one solder pin, the method comprising providing a PCB comprising at least one first through hole and at least one second through hole; soldering at least one solder pin within a respective one of the at least one first through hole; providing at least one wire through a slot in the PCB; soldering the at least one wire within a respective one of the at least one second through hole; wherein the at least one wire is provided with an interference fit within the slot.

For example, there may be provided a method of providing a connection between at least one wire and at least one microswitch in a position sensor for a motorised valve, the method comprising: providing a PCB comprising at least one first through hole and at least one second through hole; soldering at least one solder pin of at least one microswitch within a respective one of the at least one first through hole; providing at least one wire through a slot in the PCB; soldering the at least one wire within a respective one of the at least one second through hole; wherein the at least one wire is provided with an interference fit within the slot.

The PCB may be a multi-layered PCB comprising internal signal layers. The step of soldering the at least one wire within a respective one of the at least one second through hole may further comprise connecting the at least one wire to the desired internal signal layer.

The method may further comprises providing a cover around the PCB, slot and stress relieving portion of the wires to make the connection between the PCB and wires rigid. The cover may be a heat shrink material, the method further comprising heating the cover so as to provide a rigid connection between the PCB and wires.

BRIEF DESCRIPTION OF THE DRAWINGS

Preferred examples will now be described by way of example only and with reference to the drawings.

DETAILED DESCRIPTION OF THE INVENTION

Figure 1A:
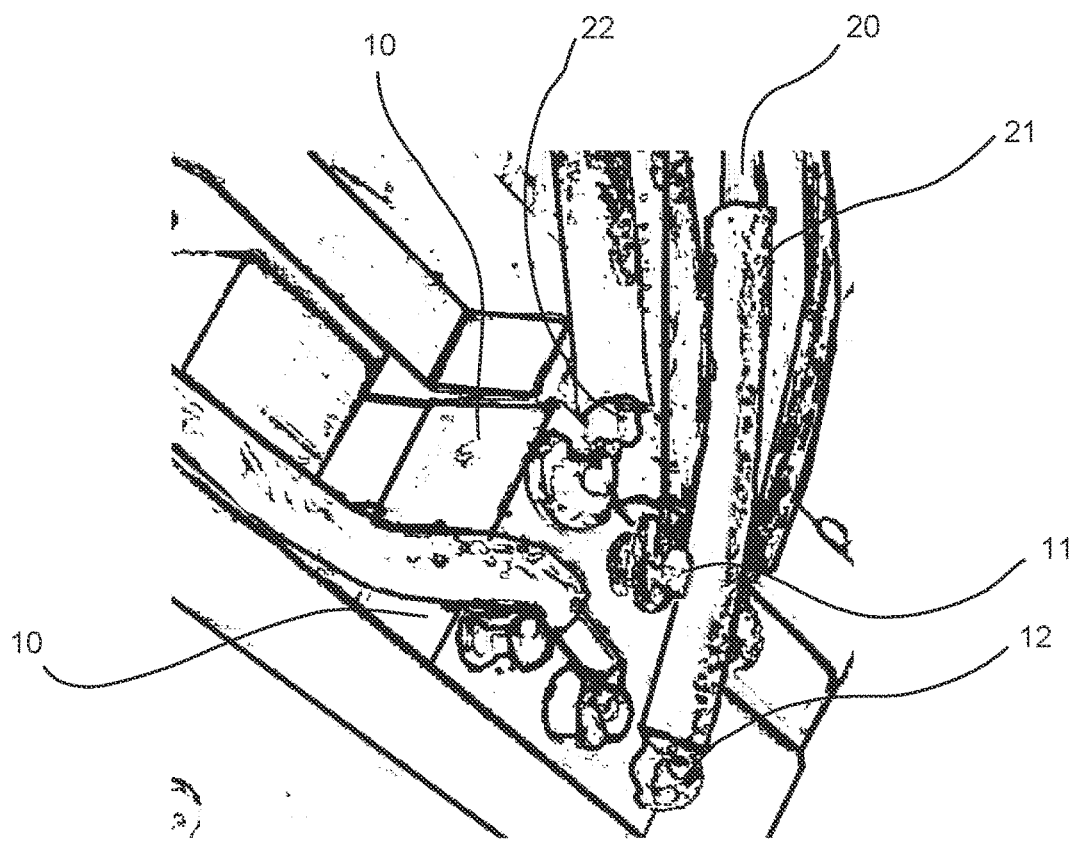
FIG. 1A shows a known configuration of stacked microswitches for a position sensor.
Figure 1B:
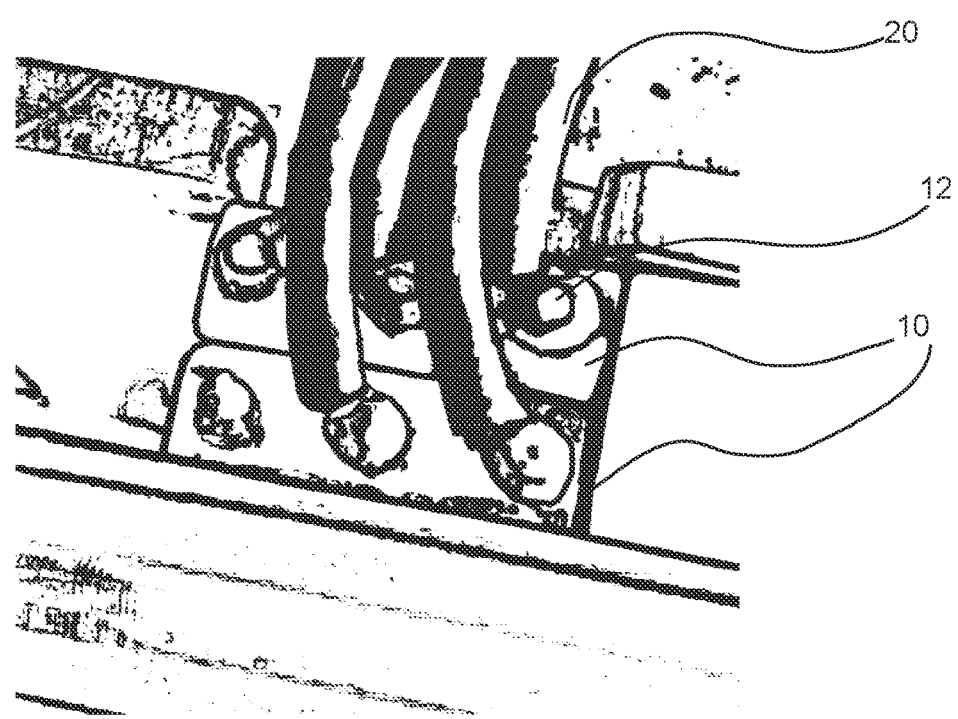
FIG. 1B shows another view of the known configuration of stacked microswitches for a position sensor of FIG. 1A.

Known connections of stacked microswitches 10 and electrical wires 20 can be seen in FIGS. 1A and 1B. Wires 20 are directly soldered to each solder pin 11 of the microswitches 10, and may provide an electrical connection between a motorised valve and the microswitches. Microswitch states are activated and deactivated by a physical connection, with the physical position of the microswitch indicating the position. For example, the microswitch states may be activated by pushing the microswitch in a known manner with respect to a rotary pall shaft with a shaped cam. Such connections can suffer from a number of issues, in use.

Firstly, wires 20 are ungainly, use a lot of space, and are vulnerable to damage when experiencing high levels of vibration. Further, separate wires are not shielded at their connections, and therefore can experience electromagnetic interference (EMI) caused when high current signals are switched in the wires 20 with high frequency, or a reduced electromagnetic compatibility (EMC). Whilst such wires 20 may be provided with insulation 21 in order to provide increased isolation between wires 20, the heat shrink cannot extend over the ends 22 of wires 20 at the solder connection 12. The wires still therefore suffer from issues relating to damage, interference and unreliability.

Further, the quality of solder connections 12 in this kind of design requires a highly qualified technician to perform the soldering, which results in a costly and time consuming assembly process. Such manually soldered connections are vulnerable to damage, and complicated to perform in recurrent assemblies. Additionally, the loose wires create tension between each other which can result in damage to the solder connections.

Examples of new and improved switches will now be described with reference to FIGS. 2 to 5C.

Figure 2A:
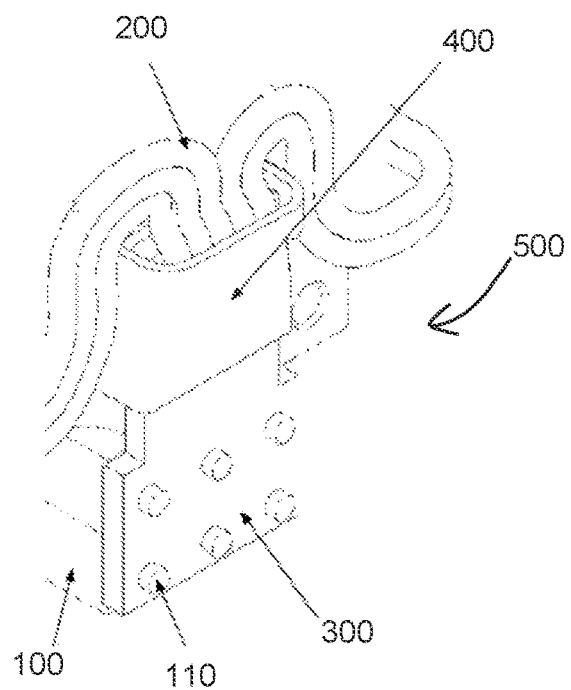
FIG. 2A shows a first schematic perspective view of a printed circuit board based connection to switches.
Figure 2B:
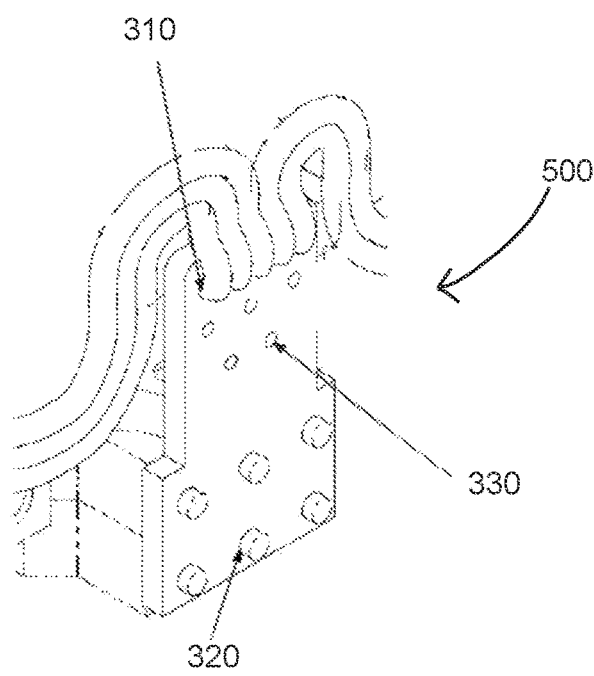
FIG. 2B shows a second schematic perspective view of a printed circuit board based connection to switches.

A printed circuit board (PCB) based connection between the wires 200 and microswitches 100 of a position sensor for a motorized valve is seen in FIGS. 2A and 2B. The printed circuit board, PCB, based connector 300 may be used for connecting at least one wire to at least one microswitch, such as those used in a position sensor for a motorised valve assembly, for example.

In FIG. 2B, the cover 400 has been removed such that the connection between wires 200 and PCB 300 may be more clearly seen The PCB 300 comprises at least one first through hole 320 and at least one second through hole 330. The at least one first through hole 320 is configured to receive a solder pin 110 of at least one microswitch 100. The at least one second through hole 330 is configured to receive at least one wire 200. The PCB 300 further comprises a slot 310 configured to receive the at least one wire 200 with an interference fit, such that a stress-relieved portion of the at least one wire 200 may be provided between the slot 310 and the at least one second through hole 330.

As can be seen in these Figures, the PCB 300 is therefore used as a base for receiving solder pins 110 of microswitches 100. These pins 110 may be connected to the base by soldering, as opposed to known methods, wherein a direct wire connection is used to connect the pins 110 to a base. In some examples, the PCB 300 may be a multi-layered PCB, as further described below with reference to FIG. 3.

The PCB 300 connects with the microswitches 100 through hole-pads 320 (i.e. the first through holes as described above), which are provided so as to extend through the PCB from a first face to a second face. This is achieved by passing solder pins 110 through these first through holes and soldering the solder pins 110 to the through holes.

The wires 200 are then positioned so as to extend, or pass through the relief slot 310 in the PCB. Each wire is then provided so as to extend from the relief slot to at least one of the second through holes 330 in the PCB 300. The wire or wires 200 may then be soldered to electrically connect to the PCB 300.

In some examples, the relief slot 310 may be specifically dimensioned so as to be configured to provide an interference fit with the number of wires that are to be connected to the PCB 300, and the microswitches 100, such that the wires 200 cannot freely move through the slot. In the example seen in FIGS. 2A and 2B, the relief slot 310 is shaped and sized so that it is only just large enough that the five wires 200 of these examples can pass through, whilst providing a tight interference fit. In this way, each wire is provided with a stress relief portion (not shown) that is soldered to the PCB 300 at the second through hole 330. As a result, forces acting on the wire or wires 200 remotely from the stress relief portion (i.e. away from the PCB 300) do not result in a movement at the soldered connection to the PCB 300, thereby preventing the transmission of forces though the soldered connection, which could otherwise result in failure of the connection.

Additionally, in some examples, the portion of the PCB 300 comprising the stress relief slot 310 through which wires 200 pass, and subsequently connect to the PCB 300 may be provided with further protection. For example, a cover 400, such as one made from a heat shrink material may be provided around the PCB 300, relief slot 310 and stress relieving portion of the wires 200, thereby making the connection between the PCB 300 and wires 200 rigid.

Advantageously, the slot 310 protects the connection between wires 200 to PCB 300 connection from mechanical damage such as stress from external forces on the wires 300, as well as corrosion. Additional protection, such as the heat shrink cover, can also be shielded and can thereby also improve protection against EMI and provide EMC. Additionally, PCB 300 improves stabilization of the microswitch 100 assembly and minimises the stress and movement of switches. Due to this, the relative movement at the solder connection between the solder pins 110 and the through hole 320 is reduced, or eliminated, improving the reliability of the electrical connection of the switches, compared to known mounting arrangements for microswitches, such as screws and glue.

As described above, wires 200 pass through relief slot 310 in the PCB. Wires 200 are then each introduced to a respective through hole 330, to which they are soldered so as to provide electrical connection to the PCB 300. The upper end of the PCB 300 covering wires 200, relief slot 310, stress-relief portion of wires 200 between the relief slot 310, the through holes 330 of the PCB 300 and the connection of wires 200 to the PCB 300 are then covered by a cover 400, which provides additional shielding and isolation of the connection between the wires and the PCB. For example, cover 400 may be a suitable heat shrink.

As may also be seen in FIGS. 4A and 4B, solder pins 110 of microswitches 100 are introduced into respective through holes 320 of the PCB 300, and soldered thereto to provide a connection between each microswitch 100 and the PCB 300.

Figure 3A:
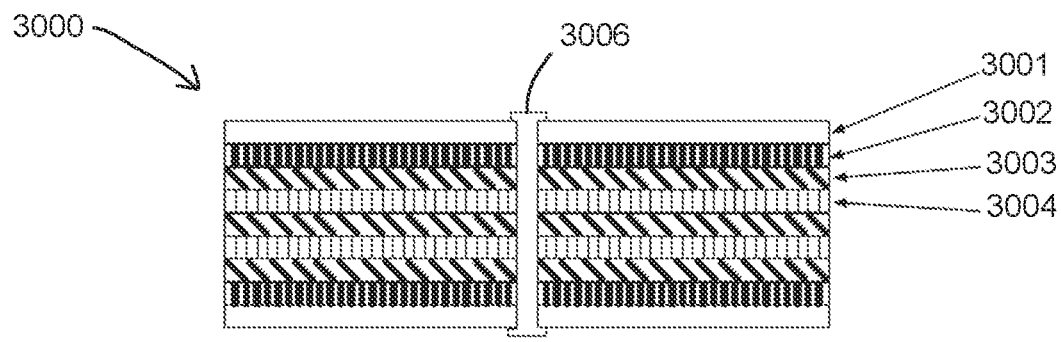
FIG. 3A is a schematic view of an exemplary multi-layered printed circuit board.
Figure 3B:
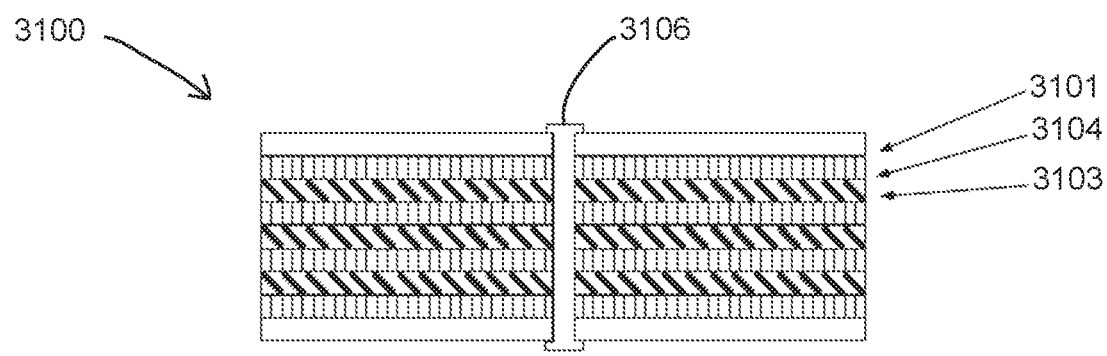
FIG. 3B is a schematic view of another exemplary multi-layered printed circuit board.
Figure 3C:
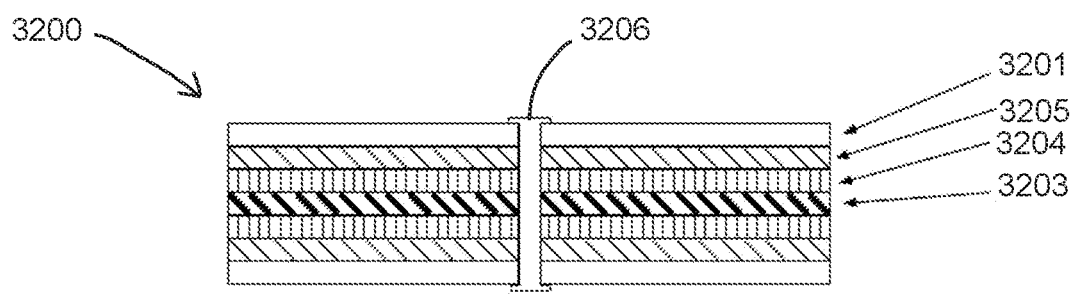
FIG. 3C is a schematic view of another exemplary multi-layered printed circuit board.

Three exemplary PCBs 3000, 3100, 3200 may be seen in FIGS. 3A, 3B and 3C, with like reference numerals indicating corresponding features. As shown in these examples, the PCB 3000, 3100, 3200 may be a multi-layered PCB. As shown in these multi-layered examples, the PCB may be provided with one or more layered sheets, allowing for a higher component density as well as more robust protection from external conditions and impacts. The multi-layered PCBs may comprise one or more of solder mask layers 3001, 3101, 3201, shielding layers 3002, laminate layers 3003, 3103, 3202, signal layers 3004, 3104, 3204, and mechanical protection layers 3205, as well as through holes 3006, 3106, 3206.

For example, the outer layers 3001, 3101, 3201 of PCBs 3000, 3100, 3200 may be solder mask layers, such as a lacquer layer for protection against oxidation, and to prevent solder bridges from forming between closely spaced solder pads. The laminate layers may provide grounding to the internal signal layers 3004, 3104, 3204 the respective PCB. The shielding layers 3002 can provide shielding to the internal signal layers, and may be made of any suitable material such as copper. Additional mechanical protection layers 3205 can further increase the robustness of the PCB to external shocks, and may also be made of any suitable material, such as laminate.

Due to these other layers, the internal signal layers (e.g. copper signal layers 3004, 3104, 3204) may additionally be protected from environmental conditions, such as increased humidity which can otherwise result in corrosion of the signal layers, particularly in harsh environments in which motorised valves are usually present.

The internal signal layers 3004, 3104, 3204 are signal layers providing electrical connections within the respective PCB, and for example may be copper layers separated by a substrate so as to isolate each layer. The PCB is further provided with through holes 3006, 3106, 3206, through which either the wires 200 or solder pins 110 of the microswitches 100 may be passed and soldered to the PCB. With reference to FIGS. 2A and 2B, specific examples of through holes 3006, 3106, 3206 are seen at through hole 330 for the wires 200 to the PCB, and at through hole 320 for connection between the solder pins 110 of the microswitches. The through holes 3006, 3106, 3206 may be configured such that any component passed through them are connected only to the desired signal layer 3004, 3104, 3204.

As would be appreciated, a PCB could comprise any combination of the above in any order so as to provide the desired characteristics. For example, the PCB 3000 of FIG. 3A utilises extra shielding in the form of shielding layer 3002, which may be a copper plane. PCB 3100 of FIG. 3B shows a basic stack of 4 signal layers 3104, providing a compact PCB. PCB 3200 of FIG. 3C shows a mechanically protected and isolated PCB, which utilises an extra layer of mechanical protection 3205 in the form of laminate layer.

By providing a connection between the microswitches and the wires via a PCB with a relief slot, it is possible to provide a more reliable connection with improved protection to both vibrations and shocks. Further, the wires are more insulated from EMI, and the assembly may be quicker and cheaper. Due to the simpler soldering process between the pad and the pin solder, a faster assembly process may be provided. These benefits are particularly apparent when the printed circuit board based connection between the wires and the microswitches is provided in a motorised valve.

A motorised valve 600 that can make use of the microswitch based position sensor with harness relief as described above can be seen in FIG. 4. In such a valve, a plurality of microswitches 100 are positioned around the valve body with respect to a shaped cam 610 of a rotary ball valve such that the contacts 130 of each microswitch 100 interacts with the shaped cam 610. As the shaped cam 610 rotates, the profile of the shaped cam 610 changes with respect to each microswitch 100, and therefore modifying the position of the contact 130 of each microswitch. Since each position of the shaped cam 610 provides a unique combination of positions of the contacts 130 of the microswitches 100, the microswitches 100 can detect the position of the shaped cam 610, and thereby detecting the position of the valve the fluid paths allowed therethrough.

Figure 4:
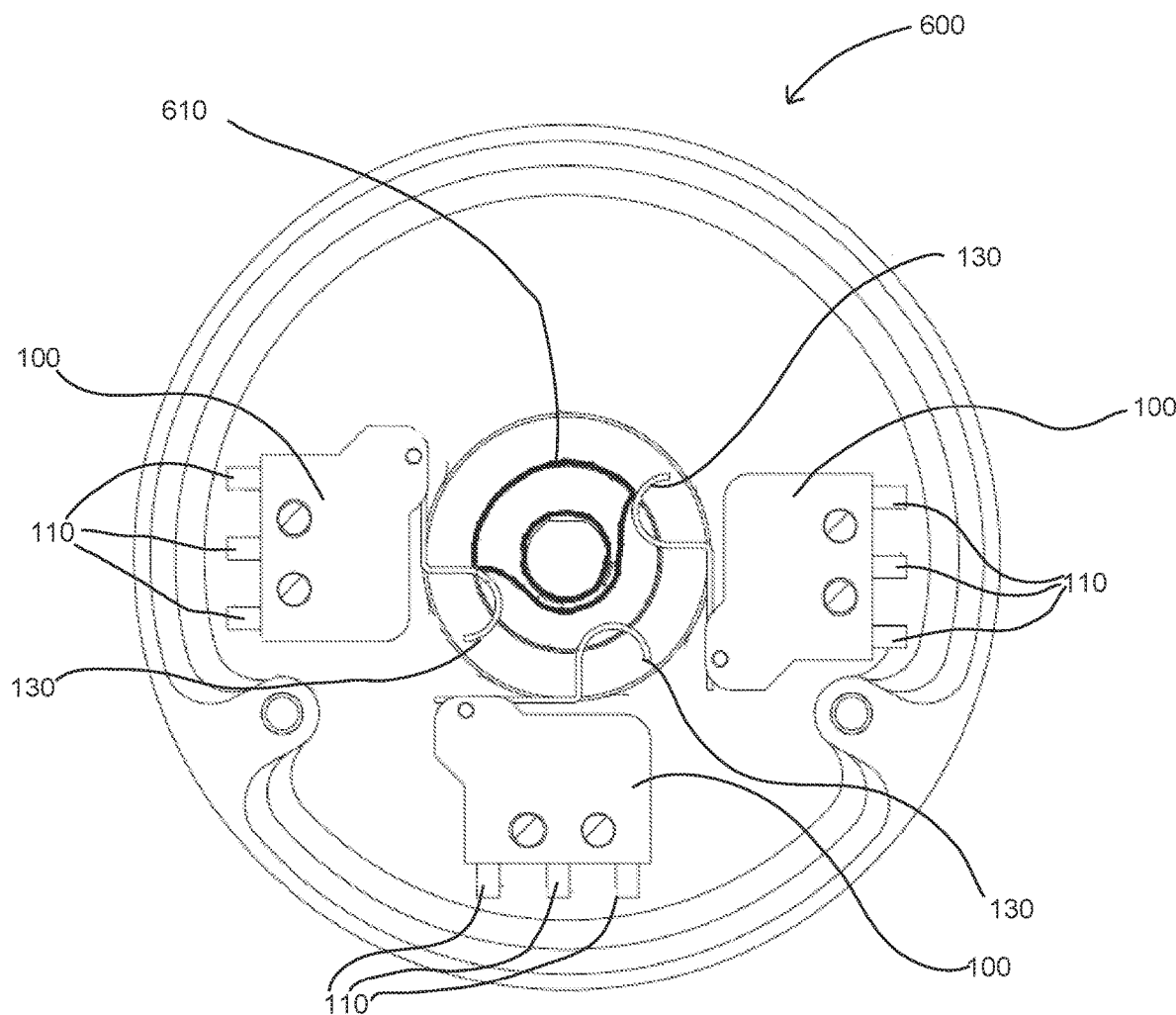
FIG. 4 is a schematic view of a motorised valve

Of course, it is envisioned that a PCB based connection could be applied to any such connection between wires and microswitches, and particularly any such valve that utilises a similar microswitch based position sensor. Additionally, whilst three microswitches are shown in FIG. 4, it would be appreciated that any appropriate number of microswitches may be utilised.

Whilst, in the prior art, the wires are typically soldered directly to the solder pins 110, this gives rise to several problems as descried above. Therefore, in order to provide a more robust, and more easily assembled motorised valve assembly, the microswitches may be mounted on a PCB board with a relief slot as described above. In this way, position of the motorised valve can be reliably detected based on the signals provided to a plurality of microswitches which are connected in an improved and more reliable manner, as described above.

Advantageously, by providing PCB that allows for a direct solder between the PCB and switches minimises the complication of wires in the area of microswitches solder pins. This further allows for space to be saved in the area of microswitches as the wires are organised and retained in a resilient way near to the PCB, allowing for a more compact valve assembly. This also provides an easy method of organising the wires, and how they attach to specific soldering pins of the desired microswitches. This also allows for a lower cost of assembly, and a quicker assembly, as the PCB harness can be prepared separately. Additionally, the necessary soldering is a lot less difficult than in known assemblies, as the soldering between the microswitch/wires and the PCB is much simpler than a direct solder between the wires and the corresponding pins of the microswitch.

The invention claimed is:

1. A microswitch based position sensor for a motorised valve comprising:
    a printed circuit board, PCB, based connector for connecting at least one wire to at least one solder pin, the PCB having at least one first through hole and at least one second through hole;
    at least one microswitch having at least one solder pin, wherein each said solder pin is provided through a respective one of the first through holes so as to electrically connect to the PCB;
    at least one wire passing through a slot on the PCB and connected to a respective one of the second through holes so as to electrically connect to the PCB; wherein the at least one wire passes through the slot with an interference fit;
    wherein the at least one wire is provided with a stress relief portion proximate the at least one second through hole, between the at least one second through hole and the slot;
    further comprising a cover provided around the PCB, slot and stress relieving portion of the wires configured to make the connection between the PCB and wires rigid; and
    wherein the at least one wire is connected to the respective one of the second through holes on a first side of the PCB, and the cover is connected to the PCB on an opposed side.

2. The microswitch base position sensor of claim 1 wherein the cover comprises a heat shrink material.

3. An assembly comprising;
    a motorised valve; and
    the microswitch based position sensor of claim 1.

4. The assembly of claim 3, wherein the motorized valve is a rotary ball valve with a shaped cam configured to variably contact a contact of each microswitch as the shaped cam rotates.

5. An assembly comprising;
    a motorised valve; and
    the microswitch based position sensor of claim 1.

6. The assembly of claim 5, wherein the motorized valve is a rotary ball valve with a shaped cam configured to variably contact a contact of each microswitch as the shaped cam rotates.

7. The microswitch based position sensor of claim 1, wherein the at least one wire is soldered to the respective one of the second through holes.

* * * * *